United States Patent
Wang

(10) Patent No.: US 10,574,221 B2
(45) Date of Patent: Feb. 25, 2020

(54) COMPARATOR, INTEGRATED CIRCUIT, AND METHOD

(71) Applicants: Semiconductor Manufacturing International (Beijing) Corporation, Beijing (CN); Semiconductor Manufacturing International (Shanghai) Corporation, Shanghai (CN)

(72) Inventor: Jun Wang, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 16/424,905

(22) Filed: May 29, 2019

(65) Prior Publication Data
US 2019/0372565 A1 Dec. 5, 2019

(30) Foreign Application Priority Data
Jun. 5, 2018 (CN) .......................... 2018 1 0566579

(51) Int. Cl.
*H03K 5/22* (2006.01)
*H03K 5/24* (2006.01)
*H03K 5/00* (2006.01)

(52) U.S. Cl.
CPC . *H03K 5/2481* (2013.01); *H03K 2005/00286* (2013.01)

(58) Field of Classification Search
CPC .................. H03K 5/2481; H03K 2005/00286
See application file for complete search history.

(56) References Cited

U.S. PATENT DOCUMENTS 7,514,966 B2 * 4/2009 Ho ....................... H03K 5/2481
327/53
9,160,231 B2 * 10/2015 Labbe .................. H02M 3/158

* cited by examiner

*Primary Examiner* — Dinh T Le
(74) *Attorney, Agent, or Firm* — Brinks Gilson & Lione

(57) ABSTRACT

The present disclosure provides a comparator, an integrated circuit, and a method. One form of the comparator includes: a first mirror unit, configured to output a dynamic current to an input unit and adjust a value of the dynamic current based on a received feedback current; a second mirror unit, configured to output a fixed current to the input unit; the input unit, configured to output a first current to a feedback unit and a second current to an output unit based on a difference between a first voltage and a second voltage, the fixed current, and the dynamic current; the feedback unit, configured to output a feedback current to the first mirror unit after receiving the first current; and the output unit, configured to: obtain the second current or a mirror current of the adjusted dynamic current, output a first comparison result in response to the second current when the first voltage is greater than the second voltage, and output a second comparison result in response to the mirror current when the first voltage is less than the second voltage. The comparator can improve a comparison speed.

14 Claims, 3 Drawing Sheets

COMPARATOR, INTEGRATED CIRCUIT, AND METHOD

RELATED APPLICATIONS

The present application claims priority to Chinese Patent Appln. No. 201810566579.6, filed Jun. 5, 2018, the entire disclosure of which is hereby incorporated by reference.

BACKGROUND

Technical Field

The present disclosure relates to the field of semiconductor technologies, and in particular, to a comparator, an integrated circuit, and a method.

Related Art

Comparators usually have advantages such as low power consumption and high precision. A mutual restriction relationship exists between a response speed and power consumption of a conventional comparator, and a higher response speed usually indicates a larger power consumption.

An existing comparator architecture may include a high-speed and low-crosstalk preamplifier, a dynamic comparator, a latch, and an offset calibration circuit. The comparator can improve a gain, increase a comparison speed and reduce crosstalk of a clock signal on an input end. However, because a large quantity of adjustable capacitors are required in the offset calibration circuit, there are relatively many parallel branches, and each branch is connected in series to a switch and a capacitor, resulting in a control circuit that is excessively complex. In addition, because a capacitor array requires a relatively high matching degree, a technological requirement is high.

Therefore, although the comparison speed of the foregoing comparator is increased, the circuit structure is complex, and the comparison speed, precision, and the like need to be further improved.

SUMMARY

A technical problem to be addressed by implementations of the present disclosure is improving a comparator, so as to improve a comparison speed.

In one aspect of implementations of the present disclosure, a comparator is provided, including: a first mirror unit, configured to output a dynamic current to an input unit and to adjust a value of the dynamic current based on a feedback current received from a feedback unit; a second mirror unit, configured to output a fixed current to the input unit; the input unit, configured to: receive a first voltage and a second voltage that are to be compared, output a first current and a second current based on a difference between the first voltage and the second voltage, the fixed current, and the dynamic current, output the first current to the feedback unit, and output the second current to an output unit; the feedback unit, configured to output a feedback current to the first mirror unit after receiving the first current; and the output unit, configured to: obtain the second current or a mirror current of the adjusted dynamic current, output a first comparison result in response to the second current when the first voltage is greater than the second voltage, and output a second comparison result in response to the mirror current when the first voltage is less than the second voltage.

In some implementations, a feedback current received by the first mirror unit when the first voltage is greater than the second voltage is less than a feedback current received by the first mirror unit when the first voltage is less than the second voltage.

In some implementations, when the first voltage is greater than the second voltage, a smaller difference between the first voltage and the second voltage indicates a larger feedback current.

In some implementations, the first mirror unit includes a first PMOS transistor and a second PMOS transistor, where a source of the first PMOS transistor and a source of the second PMOS transistor are connected to a supply voltage terminal, a gate of the first PMOS transistor is connected to a gate of the second PMOS transistor, a drain of the first PMOS transistor is connected to the gate of the first PMOS transistor and an output end of the feedback unit, and a drain of the second PMOS transistor is connected to a current input end of the input unit.

In some implementations, the feedback unit includes a first NMOS transistor, where a source of the first NMOS transistor is connected to a first output end of the input unit, a gate of the first NMOS transistor is connected to a second output end of the input unit, and a drain of the first NMOS transistor serves as the output end of the feedback unit.

In some implementations, the second mirror unit includes a third PMOS transistor and a fourth PMOS transistor, where a source of the third PMOS transistor and a source of the fourth PMOS transistor are connected to a supply voltage terminal, a gate of the third PMOS transistor is connected to a gate of the fourth PMOS transistor, a drain of the third PMOS transistor is connected to the gate of the third PMOS transistor and a current source, and a drain of the fourth PMOS transistor is connected to a current input end of the input unit.

In some implementations, the input unit includes a fifth PMOS transistor, a sixth PMOS transistor, a second NMOS transistor, a third NMOS transistor, a fourth NMOS transistor, and a fifth NMOS transistor, where a source of the fifth PMOS transistor and a source of the sixth PMOS transistor are connected together to serve as a current input end of the input unit, a gate of the fifth PMOS transistor is configured to receive the first voltage, a gate of the sixth PMOS transistor is configured to receive the second voltage, a drain of the fifth PMOS transistor is connected to a drain of the second NMOS transistor, a drain of the third NMOS transistor and a gate of the fourth NMOS transistor, a drain of the sixth PMOS transistor is connected to a drain of the fifth NMOS transistor, a drain of the fourth NMOS transistor and a gate of the third NMOS transistor, the drain of the second NMOS transistor and a gate of the second NMOS transistor are connected together to serve as a second output end of the input unit, the drain of the fifth NMOS transistor and a gate of the fifth NMOS transistor are connected together to serve as a third output end of the input unit, and a source of the second NMOS transistor, a source of the third NMOS transistor, a source of the fourth NMOS transistor and a source of the fifth NMOS transistor are all grounded and together serve as a first output end of the input unit.

In some implementations, the output unit includes a seventh PMOS transistor and a sixth NMOS transistor, where a source of the seventh PMOS transistor is connected to a supply voltage terminal, a gate of the seventh PMOS transistor is connected to a gate of the second PMOS transistor, a drain of the seventh PMOS transistor is connected to a drain of the sixth NMOS transistor, a gate of the sixth NMOS transistor is connected to a third output end of the input unit, and a source of the sixth NMOS transistor is grounded.

In some implementations, the output unit further includes a shaping filter; and an input end of the shaping filter is connected to the drain of the seventh PMOS transistor, and an output end of the shaping filter is configured to output the first comparison result or the second comparison result.

In some implementations, the shaping filter includes a first phase inverter and a second phase inverter that are cascaded, where an input end of the first phase inverter is connected to the drain of the seventh PMOS transistor, an output end of the first phase inverter is connected to an input end of the second phase inverter, and an output end of the second phase inverter serves as the output end of the shaping filter.

In some implementations, the output unit further includes a seventh NMOS transistor, connected to the shaping filter, and configured to control the shaping filter to output the first comparison result or the second comparison result after receiving an enabling signal.

In some implementations, a level of the first comparison result is lower than a level of the second comparison result.

In another aspect of implementations of the present disclosure, an integrated circuit is provided, including the comparator described above.

In yet another aspect of implementations of the present disclosure, a method for comparing voltage values using the comparator described above is provided, including: outputting, by a first mirror unit, a dynamic current to an input unit, and outputting, by a second mirror unit, a fixed current to the input unit; receiving, by the input unit, a first voltage and a second voltage that are to be compared, outputting a first current and a second current based on a difference between the first voltage and the second voltage, the fixed current, and the dynamic current, outputting the first current to a feedback unit, and outputting the second current to an output unit; outputting, by the feedback unit, a feedback current to the first mirror unit after receiving the first current; adjusting, by the first mirror unit, a value of the dynamic current based on the feedback current received from the feedback unit; and obtaining, by the output unit, the second current or a mirror current of the adjusted dynamic current, outputting a first comparison result in response to the second current when the first voltage is greater than the second voltage, and outputting a second comparison result in response to the mirror current when the first voltage is less than the second voltage.

In some implementations of the comparator, the first mirror unit outputs the dynamic current to the input unit, the second mirror unit outputs the fixed current to the input unit; the input unit receives the first voltage and the second voltage that are to be compared, outputs the first current and the second current based on the difference between the first voltage and the second voltage, the fixed current, and the dynamic current, outputs the first current to the feedback unit, and outputs the second current to the output unit; the feedback unit outputs the feedback current to the first mirror unit after receiving the first current; the first mirror unit adjusts the value of the dynamic current based on the feedback current, thereby implementing dynamic adjustment; and the output unit outputs a comparison result after obtaining the second current or the mirror current of the adjusted dynamic current. The comparator can overcome a mutual restriction relationship between a speed and power consumption in a conventional comparator circuit, and dynamically adjust a characteristic of the comparator based on an operation status of the comparator without affecting precision of the comparator, thereby implementing low power consumption and a high-speed response.

Through the following detailed descriptions of exemplary embodiments and implementations of the present disclosure with reference to the accompanying drawings, other features and advantages of the present disclosure become clear.

BRIEF DESCRIPTION OF THE DRAWINGS

Accompanying drawings constituting a part of the specification describe embodiments and implementations of the present disclosure, and together with the specification, serve to explain the principles of the present disclosure.

The present disclosure may be more clearly understood based on the following detailed descriptions with reference to the accompanying drawings.

DETAILED DESCRIPTION

Figure 1:
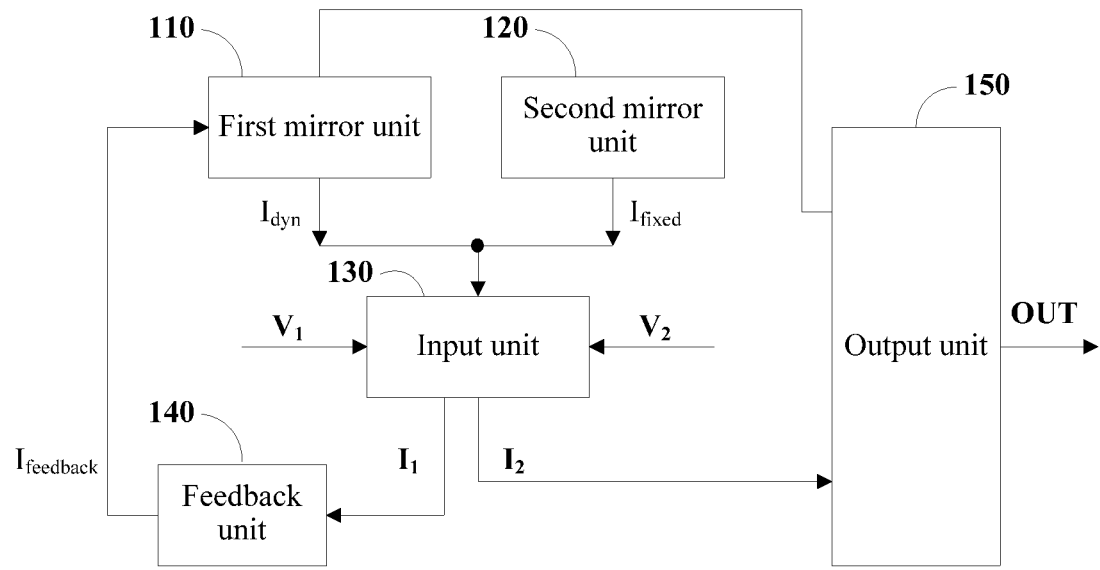
FIG. 1 is a schematic circuit connection diagram of a comparator according to some implementations of the present disclosure.

Various exemplary embodiments and implementations of the present disclosure are now described in detail with reference to the accompanying drawings. It should be noted that unless otherwise specifically stated, the relative arrangement, numeric expression, and values of components and steps explained in these embodiments and implementations do not limit the scope of the present disclosure.

In addition, it should be understood that for ease of description, the sizes of parts shown in the accompanying drawings are not drawn according to actual proportional relationships.

The following description of at least one exemplary embodiment is illustrative, and is not intended to limit the present disclosure and the applications or uses thereof.

Technologies, methods, and devices known by a person of ordinary skill in the art may not be discussed in detail, and they should be considered as a part of the specification, if appropriate.

In all examples shown and discussed herein, any specific value should be understood to be exemplary rather than limitative. Therefore, other examples of exemplary embodiments and implementations may have different values.

It should be noted that similar reference numerals and letters represent similar items in the accompanying drawings below. Therefore, if an item is defined in an accompanying drawing, the item does not need to be further discussed in the subsequent accompanying drawings.

FIG. 1 is a schematic circuit connection diagram of a comparator according to some implementations of the present disclosure. As shown in FIG. 1, the comparator may include: a first mirror unit 110, a second mirror unit 120, an input unit 130, a feedback unit 140, and an output unit 150.

The first mirror unit 110 may be configured to output a dynamic current $I_{dyn}$ to the input unit 130 and adjust a value of the dynamic current $I_{dyn}$ based on a feedback current $I_{feedback}$ received from the feedback unit 140, thereby enabling the first mirror unit 110 to output the adjusted dynamic current to the input unit 130.

The second mirror unit 120 may be configured to output a fixed current $I_{fixed}$ to the input unit 130.

The input unit 130 may be configured to: receive a first voltage $V_1$ and a second voltage $V_2$ that are to be compared, output a first current $I_1$ and a second current $I_2$ based on a difference between the first voltage $V_1$ and the second voltage $V_2$ (that is, the difference of $V_1-V_2$), the fixed current $I_{fixed}$, and the dynamic current $I_{dyn}$, output the first current $I_1$ to the feedback unit 140, and output the second current $I_2$ to the output unit 150.

The feedback unit 140 may be configured to output a feedback current $I_{feedback}$ to the first mirror unit 110 after receiving the first current $I_1$.

The output unit 150 may be configured to: obtain the second current $I_2$ or a mirror current of the adjusted dynamic current $I_{dyn}$, output a first comparison result in response to the second current $I_2$ when the first voltage $V_1$ is greater than the second voltage $V_2$, and output a second comparison result in response to the mirror current when the first voltage $V_1$ is less than the second voltage $V_2$. In some embodiments, a level of the first comparison result is lower than a level of the second comparison result. For example, the first comparison result is a low level (which represents a digital signal "0"), and the second comparison result is a high level (which represents a digital signal "1"). That is, when $V_1$ is greater than $V_2$, the comparator outputs "0", and when $V_1$ is less than $V_2$, the comparator outputs "1".

In some implementations, a feedback current $I_{feedback}$ received by the first mirror unit 110 when the first voltage $V_1$ is greater than the second voltage $V_2$ is less than a feedback current $I_{feedback}$ received by the first mirror unit 110 when the first voltage $V_1$ is less than the second voltage $V_2$. In some implementations, when the first voltage $V_1$ is greater than the second voltage $V_2$, a smaller difference between the first voltage $V_1$ and the second voltage $V_2$ indicates a larger feedback current $I_{feedback}$.

Therefore, when $V_1$ is greater than $V_2$ (for example, when the difference of $V_1-V_2$ is greater than tens of millivolts (for example, 40 mV)), the dynamic current of the first mirror unit is nearly 0, and as the difference of $V_1-V_2$ gradually decreases, a current of the first mirror unit gradually increases. When $V_1$ is greater than $V_2$, a sum of the dynamic current and the fixed current that are output to the input unit is relatively small, and voltage values comparing by the comparator is more easily controlled. Therefore, when $V_1$ is greater than $V_2$, the comparator operates in a high-precision comparison stage. When $V_1-V_2$ is less than 0 (that is $V_1$ is less than $V_2$), the current of the first mirror unit increases to maximum, the sum of the dynamic current and the fixed current that are output to the input unit is relatively large, and the comparator compares the voltage values at a higher speed. Therefore, when $V_1$ is less than $V_2$, the comparator operates in a high-speed comparison stage (or referred to as a high-speed jumping stage).

In the comparator circuit in the foregoing embodiments, the feedback unit and the first mirror unit may form a dynamic positive compensation structure. The first mirror unit outputs the dynamic current to the input unit, the second mirror unit outputs the fixed current to the input unit; the input unit receives the first voltage and the second voltage that are to be compared, outputs the first current and the second current based on the difference between the first voltage and the second voltage, the fixed current, and the dynamic current, outputs the first current to the feedback unit, and outputs the second current to the output unit; the feedback unit outputs the feedback current to the first mirror unit after receiving the first current; the first mirror unit adjusts the value of the dynamic current based on the feedback current, thereby implementing dynamic adjustment; and the output unit outputs a comparison result after obtaining the second current or the mirror current of the adjusted dynamic current.

During operation of some implementations of the comparator, when $V_1$ is greater than $V_2$, the comparator is in the high-precision comparison stage; and when $V_1$ is less than $V_2$, the comparator is in the high-speed comparison stage. Therefore, the comparator in implementations of the present disclosure can improve a comparison speed. The comparator in implementations of the present disclosure can overcome a mutual restriction relationship between a speed and power consumption in a conventional comparator circuit, and dynamically adjust a characteristic of the comparator based on an operation status of the comparator without affecting precision of the comparator, thereby implementing a high-speed response. When the comparator is applied to a system, low power consumption of the system can be implemented.

Figure 2:
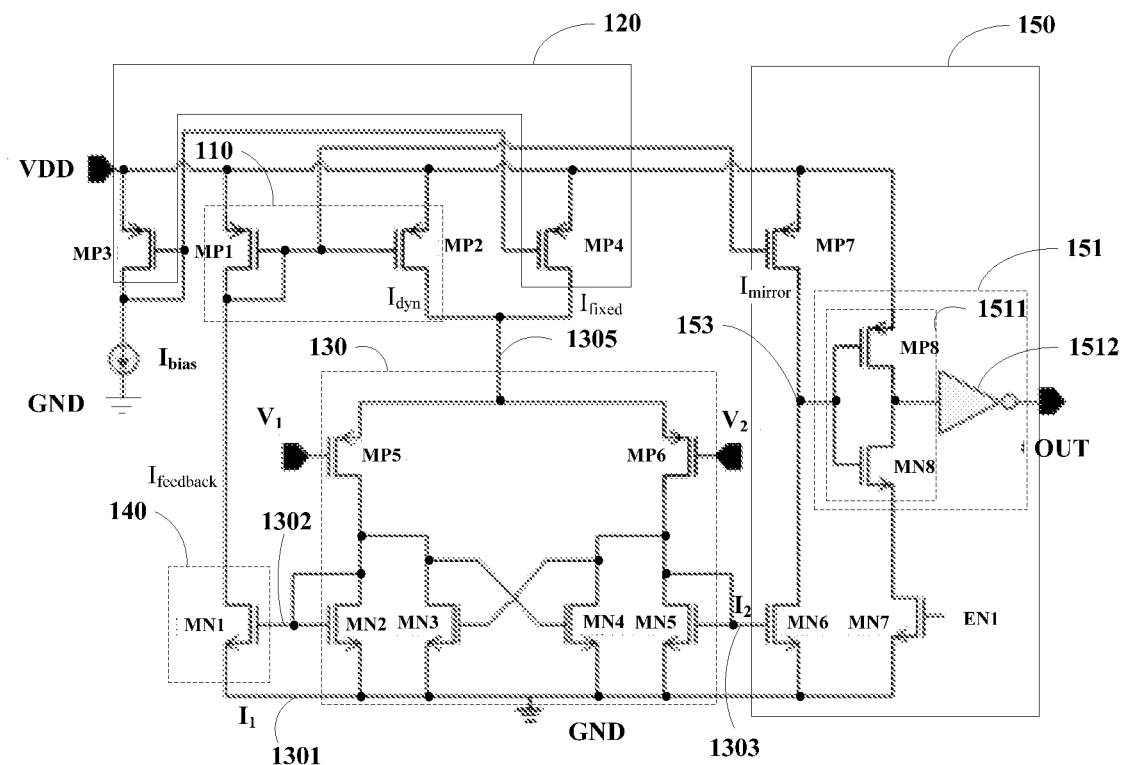
FIG. 2 is a schematic circuit connection diagram of a comparator according to other implementations of the present disclosure.

FIG. 2 is a schematic circuit connection diagram of a comparator according to other implementations of the present disclosure. In FIG. 2, a specific circuit implementation of a first mirror unit 110, a second mirror unit 120, an input unit 130, a feedback unit 140, and an output unit 150 is shown. The following describes specific circuit connection structures of the first mirror unit 110, the second mirror unit 120, the input unit 130, the feedback unit 140, and the output unit 150 according to some implementations of the present disclosure in detail with reference to FIG. 2.

In some implementations, as shown in FIG. 2, the first mirror unit 110 may include a first positive channel metal oxide semiconductor (PMOS) transistor MP1 and a second PMOS transistor MP2. A source of the first PMOS transistor MP1 and a source of the second PMOS transistor MP2 are connected to a supply voltage terminal VDD. A gate of the first PMOS transistor MP1 is connected to a gate of the second PMOS transistor MP2. A drain of the first PMOS transistor MP1 is connected to the gate of the first PMOS transistor MP1 and an output end of the feedback unit 140. A drain of the second PMOS transistor MP2 is connected to a current input end 1305 of the input unit 130.

In some implementations, as shown in FIG. 2, the second mirror unit 120 may include a third PMOS transistor MP3 and a fourth PMOS transistor MP4. A source of the third PMOS transistor MP3 and a source of the fourth PMOS transistor MP4 are connected to a supply voltage terminal VDD. A gate of the third PMOS transistor MP3 is connected to a gate of the fourth PMOS transistor MP4. A drain of the third PMOS transistor MP3 is connected to the gate of the third PMOS transistor MP3 and a current source $I_{bias}$. A drain of the fourth PMOS transistor MP4 is connected to a current input end 1305 of the input unit 130.

In some implementations, as shown in FIG. 2, the feedback unit 140 may include a first negative channel metal oxide semiconductor (NMOS) transistor MN1. A source of the first NMOS transistor MN1 is connected to a first output end 1301 of the input unit 130. A gate of the first NMOS transistor MN1 is connected to a second output end 1302 of the input unit 130. A drain of the first NMOS transistor MN1 serves as the output end of the feedback unit 140. For example, the drain of the first NMOS transistor MN1 is connected to the drain of the first PMOS transistor MP1.

In some implementations, as shown in FIG. 2, the input unit 130 may include a fifth PMOS transistor MP5, a sixth PMOS transistor MP6, a second NMOS transistor MN2, a third NMOS transistor MN3, a fourth NMOS transistor MN4, and a fifth NMOS transistor MN5.

As shown in FIG. 2, a source of the fifth PMOS transistor MP5 and a source of the sixth PMOS transistor MP6 are connected together to serve as a current input end 1305 of the input unit 130. A gate of the fifth PMOS transistor MP5 is configured to receive the first voltage $V_1$. A gate of the sixth PMOS transistor MP6 is configured to receive the second voltage $V_2$. A drain of the fifth PMOS transistor MP5 is connected to a drain of the second NMOS transistor MN2, a drain of the third NMOS transistor MN3 and a gate of the fourth NMOS transistor MN4. A drain of the sixth PMOS transistor MP6 is connected to a drain of the fifth NMOS transistor MN5, a drain of the fourth NMOS transistor MN4 and a gate of the third NMOS transistor MN3. The drain of the second NMOS transistor MN2 and a gate of the second NMOS transistor MN2 are connected together to serve as a second output end 1302 of the input unit 130. The drain of the fifth NMOS transistor MN5 and a gate of the fifth NMOS transistor MN5 are connected together to serve as a third output end 1303 of the input unit 130. A source of the second NMOS transistor MN2, a source of the third NMOS transistor MN3, a source of the fourth NMOS transistor MN4 and a source of the fifth NMOS transistor MN5 are all grounded (GND) and together serve as a first output end 1301 of the input unit 130.

In some implementations, as shown in FIG. 2, the output unit 150 may include a seventh PMOS transistor MP7 and a sixth NMOS transistor MN6. A source of the seventh PMOS transistor MP7 is connected to a supply voltage terminal VDD. A gate of the seventh PMOS transistor MP7 is connected to a gate of a second PMOS transistor MP2. A drain of the seventh PMOS transistor MP7 is connected to a drain of the sixth NMOS transistor MN6. Drains of the two transistors MP7 and MN6 are both connected to a node 153. A gate of the sixth NMOS transistor MN6 is connected to a third output end 1303 of the input unit 130. A source of the sixth NMOS transistor MN6 is grounded. A dynamic current of the second PMOS transistor MP2 may be mirrored to flow through the seventh PMOS transistor MP7 to obtain the mirror current $I_{mirror}$ of the dynamic current $I_{dyn}$. The transistors MP7 and MN6 may produce an amplification effect together.

In some implementations, as shown in FIG. 2, the output unit 150 may further include a shaping filter 151. An input end of the shaping filter 151 is connected to the drain of the seventh PMOS transistor MP7. An output end of the shaping filter 151 is configured to output the first comparison result or the second comparison result. For example, as shown in FIG. 2, the shaping filter 151 may include a first phase inverter 1511 and a second phase inverter 1512 that are cascaded. An input end of the first phase inverter 1511 is connected to the drain of the seventh PMOS transistor MP7, an output end of the first phase inverter 1511 is connected to an input end of the second phase inverter 1512, and an output end of the second phase inverter 1512 serves as the output end OUT of the shaping filter 151.

For example, as shown in FIG. 2, the first phase inverter 1511 may include an eighth PMOS transistor MP8 and an eighth NMOS transistor MN8. The second phase inverter 1512 may have a circuit structure similar to that of the first phase inverter 1511, and details are not described herein again.

In some implementations, the two phase inverters 1511 and 1512 may together serve as the shaping filter, thereby producing an effect of shaping filtering and amplifying a signal, and may output the first comparison result (for example, the digital signal "0") or the second comparison result (for example, the digital signal "1").

It should be noted that in other implementations, the output unit 150 may alternatively not include the foregoing shaping filter 151. That is, the output unit 150 may output a comparison result on the node 153 by using the seventh PMOS transistor MP7 and the sixth NMOS transistor MN6 that are connected to each other. Therefore, the scope of the present disclosure is not limited to only the circuit structure of the output unit shown in FIG. 2.

In some implementations, as shown in FIG. 2, the output unit 150 may further include a seventh NMOS transistor MN7. The seventh NMOS transistor MN7 is connected to the shaping filter 151. For example, a drain of the seventh NMOS transistor MN7 is connected to a source of the eighth NMOS transistor MN8, a source of the seventh NMOS transistor MN7 is grounded, and a gate of the seventh NMOS transistor MN7 may be configured to receive an enabling signal EN1. The seventh NMOS transistor MN7 may be configured to control the shaping filter 151 to output the first comparison result or the second comparison result after receiving the enabling signal EN1. For example, the gate of the seventh NMOS transistor MN7 is turned on after receiving a high level (which serves as the enabling signal), so that the first phase inverter 1511 operates, and further the shaping filter 151 operates to output a corresponding comparison result.

In some implementations, the comparator may include the supply voltage terminal VDD and the current source $I_{bias}$. That is, the supply voltage terminal VDD and the current source $I_{bias}$ may be integrated with other transistors of the comparator. In other embodiments, the comparator may alternatively not include the supply voltage terminal VDD and the current source $I_{bias}$. That is, the supply voltage terminal VDD and the current source $I_{bias}$ may be disposed out of the circuit structure of the comparator.

The following describes an operation process of the comparator in the embodiments of the present disclosure in detail with reference to the circuit structure of the comparator shown in FIG. 2.

As shown in FIG. 2, the first mirror unit 110 and the second mirror unit 120 may serve as a differential pair tail current source together. For example, a dynamic current part in the differential pair tail current source is implemented by using the first mirror unit that includes the transistors MP1 and MP2. For example, the current $I_{bias}$ is mirrored and biased by using the second mirror unit 120 that includes the transistors MP3 and MP4, thereby generating a fixed current part in the differential pair tail current source. In addition, the input unit 130 uses a transconductance enhancement structure (that is, a circuit structure including the transistors MN2, MN3, MN4 and MN5), and introduces a positive feedback mechanism by using the feedback unit 140 to further increase a response speed of the comparator, and the transconductance enhancement structure can improve an amplification capability.

When the first voltage $V_1$ is greater than the second voltage $V_2$, the sixth PMOS transistor MP6 is turned on more fully than the fifth PMOS transistor MP5. Therefore, currents (which include the dynamic current and the fixed current) flowing into the input unit 130 by using the current input end 1305 mainly flow through the sixth PMOS transistor MP6, and few currents flow through the fifth PMOS transistor MP5. Because few currents flow through the fifth PMOS transistor MP5, currents output to the gate of the first NMOS transistor MN1 by using the second output end 1302 are few, a voltage applied to the gate of the transistor MN1 is relatively small, and the transistor MN1 is caused to be nearly turned off. Therefore, the first current $I_1$ (that is, a sum of currents flowing out of the sources of the transistors MN2, MN3, MN4 and MN5) can hardly flow through the transistor MN1. This causes a feedback current output by the first NMOS transistor MN1 to the first PMOS transistor MP1 to be nearly 0, so that a current on the second PMOS transistor MP2 is nearly 0 (for example, when the difference of $V_1$-$V_2$ is greater than tens of millivolts, a current on the second PMOS transistor MP2 is nearly 0), and the mirror current $I_{mirror}$ on the seventh PMOS transistor MP7 is nearly 0. As the difference of $V_1$-$V_2$ gradually decreases, the current on the transistor MP2 gradually increases. However, as a whole, when the first voltage $V_1$ is greater than the second voltage $V_2$, a sum of the dynamic current and the fixed current is relatively small, and voltage values comparing by the comparator is more easily controlled. Therefore, when $V_1$ is greater than $V_2$, the comparator operates in a high-precision comparison stage. Because relatively many currents flow through the sixth PMOS transistor MP6, and the second current $I_2$ is output to the sixth NMOS transistor MN6 of the output unit 150 by using the third output end 1303, the sixth NMOS transistor MN6 is turned on. This causes the node 153 to be grounded, and therefore a low level "0" is output as the first comparison result by using the two phase inverters 1511 and 1512.

When the first voltage $V_1$ is less than the second voltage $V_2$, the fifth PMOS transistor MP5 is turned on more fully than the sixth PMOS transistor MP6. Therefore, the currents (which include the dynamic current and the fixed current) flowing into the input unit 130 by using the current input end 1305 mainly flow through the fifth PMOS transistor MP5, and few currents flow through the sixth PMOS transistor MP6. Because relatively many currents flow through the fifth PMOS transistor MP5, relatively many currents are output to the gate of the first NMOS transistor MN1 by using the second output end 1302, the voltage applied to the gate of the transistor MN1 is relatively large, and the transistor MN1 is caused to be turned on. Therefore, after the first current $I_1$ (that is, the sum of the currents flowing out of the sources of the transistors MN2, MN3, MN4 and MN5) is output to the transistor MN1 by using the first output end 1301, a feedback current output by the transistor MN1 to the first mirror unit 110 is basically equal to the first current. This causes the current on the second PMOS transistor MP2 to be relatively large (for example, the current may reach a maximum current). The seventh PMOS transistor MP7 mirrors the current on the second PMOS transistor MP2 (that is, the mirror current $I_{mirror}$, as shown in FIG. 2), so that a potential of the node 153 is relatively high, and a high level "1" is output as the second comparison result by using the two phase inverters 1511 and 1512. When $V_1$ is less than $V_2$, the current on the transistor MP2 is relatively large, the sum of the dynamic current and the fixed current that are output to the input unit is relatively large, and the comparator compares the voltage values at a higher speed. Therefore, when $V_1$ is less than $V_2$, the comparator operates in a high-speed comparison stage.

Therefore, in a process of a potential difference of $V_1$-$V_2$ transitioning from a state greater than 0 to a state less than 0, the current on the second PMOS transistor MP2 gradually increases from nearly 0, so that the comparator transitions from a high-precision comparison state to the high-speed comparison stage.

In conclusion, in the circuit structure of the comparator according to some implementations of the present disclosure, by combining with the transconductance enhancement structure and a dynamic tail current technology and using the positive feedback mechanism, a differential pair load current is mirrored in real time to adjust a value of a differential pair tail current, thereby adjusting a gain and a speed of the comparator based on a status of the circuit, and implementing a dynamic enhancement effect. The comparator in embodiments and implementations of the present disclosure can overcome a mutual restriction relationship between a speed and power consumption in a conventional comparator circuit. The high-precision comparator that has the dynamic enhancement effect and that is provided in the present disclosure dynamically adjusts a characteristic of the comparator based on an operation status of the comparator without affecting precision of the comparator, thereby implementing low power consumption and a high-speed response.

Figure 3:
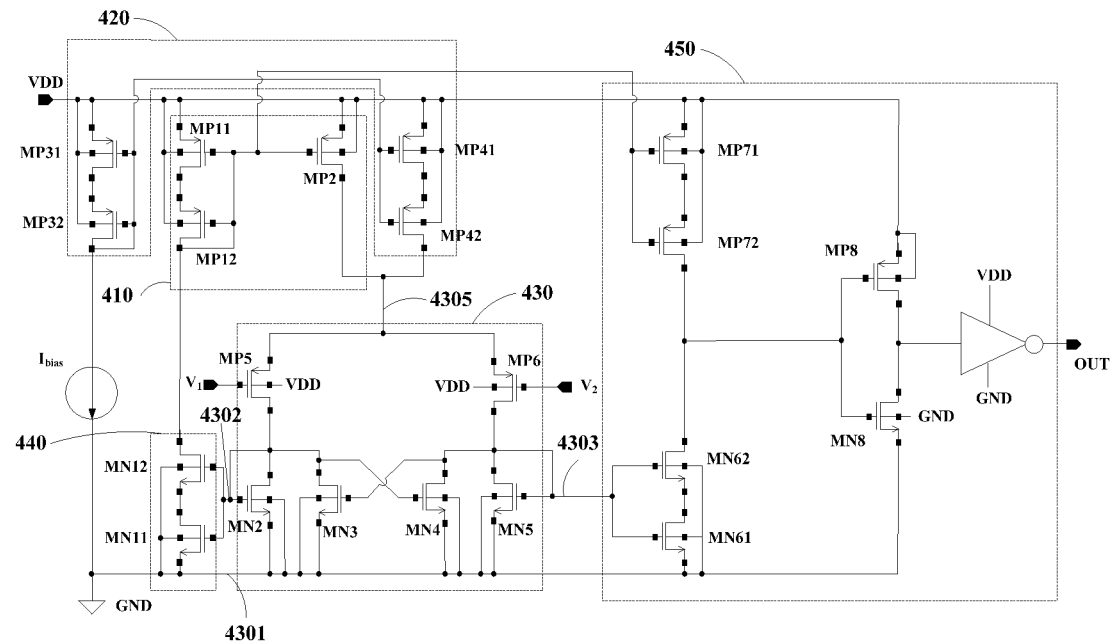
FIG. 3 is a schematic circuit connection diagram of a comparator according to yet other implementations of the present disclosure.

FIG. 3 is a schematic circuit connection diagram of a comparator according to other implementations of the present disclosure. In the foregoing descriptions of FIG. 2, the first PMOS transistor MP1, the third PMOS transistor MP3, the fourth PMOS transistor MP4, the first NMOS transistor MN1, the seventh PMOS transistor MP7 and the sixth NMOS transistor MN6 each show one transistor. However, to improve stability of currents flowing through corresponding transistors, the quantity of each of the foregoing transistors may be set to be more than one, for example, may be set to be two (as shown in FIG. 3). Therefore, the scope of the present disclosure is not limited thereto. The following describes differences from the circuit structure of the comparator shown in FIG. 2 in detail with reference to FIG. 3. For same or similar content, details are not described again.

In some implementations, as shown in FIG. 3, a first mirror unit 410 may include two first PMOS transistors MP11 and MP12, and a second PMOS transistor MP2. Herein, a source of a first first PMOS transistor MP11 is connected to a supply voltage terminal VDD, and a drain of the first first PMOS transistor MP11 is connected to a source of a second first PMOS transistor MP12. A drain of the second first PMOS transistor MP12 is connected to an output end of a feedback unit 440. Gates of the two first PMOS transistors MP11 and MP12 are connected to a gate of the second PMOS transistor MP2. In the embodiments, the two first PMOS transistors are disposed in the first mirror unit, so that a relatively stable dynamic current can be obtained.

In some implementations, as shown in FIG. 3, a second mirror unit 420 may include two third PMOS transistors MP31 and MP32, and two fourth PMOS transistors MP41 and MP42. A source of a first third PMOS transistor MP31 is connected to the supply voltage terminal VDD, and a drain of the first third PMOS transistor MP31 is connected to a source of a second third PMOS transistor MP32. A drain of the second third PMOS transistor MP32 is connected to a current source $I_{bias}$. A source of a first fourth PMOS transistor MP41 is connected to the supply voltage terminal VDD, and a drain of the first fourth PMOS transistor MP41 is connected to a source of a second fourth PMOS transistor MP42. A drain of the second fourth PMOS transistor MP42 is connected to a current input end 4305 of an input unit 430. Gates of the two third PMOS transistors MP31 and MP32 are connected to gates of the two fourth PMOS transistors MP41 and MP42. In some implementations, the two third PMOS transistors and the two fourth PMOS transistors are disposed in the second mirror unit, so that a relatively stable fixed current can be obtained.

In some implementations, as shown in FIG. 3, the feedback unit 440 may include two first NMOS transistors MN11 and MN12. A source of a first first NMOS transistor MN11 is connected to a first output end 4301 of the input unit 430 and is grounded, and a drain of the first first NMOS transistor MN11 is connected to a source of a second first NMOS transistor MN12. A drain of the second first NMOS transistor MN12 serves as the output end of the feedback unit 440, for example, is connected to the drain of the second first PMOS transistor MP12. Gates of the two first NMOS transistors MN11 and MN12 are connected together and are both connected to a second output end 4302 of the input unit 430. In the embodiments, the two first NMOS transistors are disposed in the feedback unit 440, helping a feedback current be more stably fed back to the first mirror unit.

In some implementations, as shown in FIG. 3, an output unit 450 may include two seventh PMOS transistors MP71 and M72, and two sixth NMOS transistors MN61 and MN62. A source of a first seventh PMOS transistor MP71 is connected to the supply voltage terminal VDD, and a drain of the first seventh PMOS transistor MP71 is connected to a source of a second seventh PMOS transistor MP72. A drain of the second seventh PMOS transistor MP72 is connected to a drain of a second sixth NMOS transistor MN62. Gates of the two seventh PMOS transistors MP71 and M72 are connected to the gate of the second PMOS transistor MP2 together. A source of a first sixth NMOS transistor MN61 is grounded, and a drain of the first sixth NMOS transistor MN61 is connected to a source of the second sixth NMOS transistor MN62. Gates of the two sixth NMOS transistors MN61 and MN62 are connected to a third output end 4303 of the input unit 430 together. In some implementations, the two seventh PMOS transistors and the two sixth NMOS transistors are disposed in the output unit, so that a more stable current can be obtained, thereby outputting a more stable comparison result.

Figure 4:
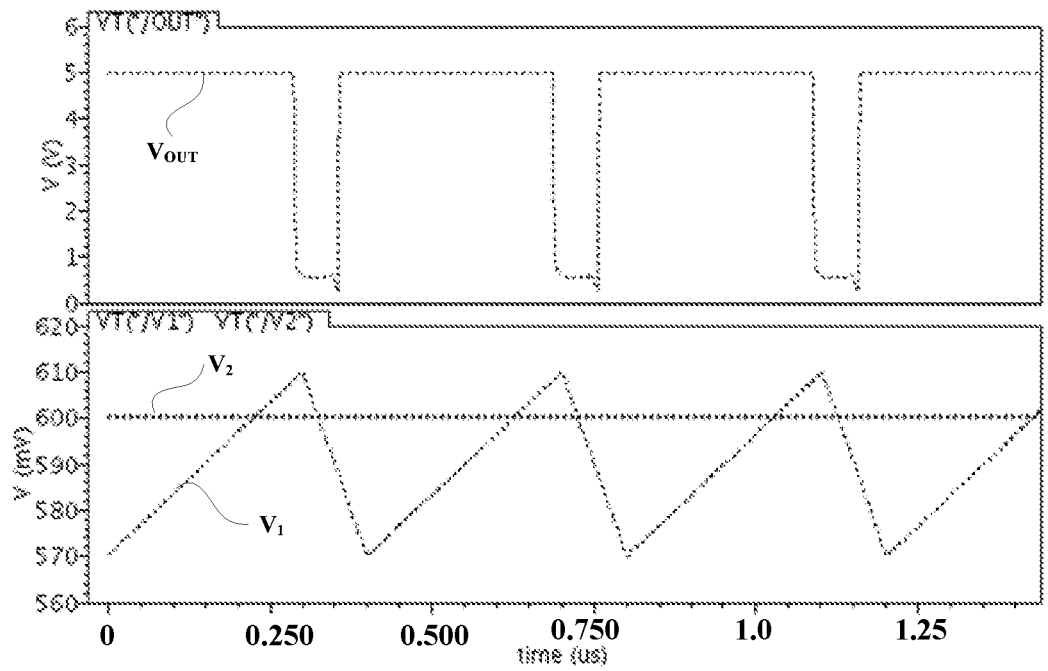
FIG. 4 is a schematic simulation result diagram of a comparator according to some implementations of the present disclosure.

FIG. 4 is a schematic simulation result diagram of a comparator according to some embodiments of the present disclosure. FIG. 4 shows a first voltage $V_1$ and a second voltage $V_2$ input to the comparator, and a comparison result $V_{OUT}$ output from the comparator. It can be learned from FIG. 4 that a falling edge delay of a waveform of the comparison result $V_{OUT}$ may be 67 ns, and a rising edge delay may be 30 ns. This improves a response speed and precision of a circuit.

In embodiments and implementations of the present disclosure, an integrated circuit may be further provided. The integrated circuit may include the comparator described above, for example, the comparator shown in FIG. 1, FIG. 2, or FIG. 3.

Figure 5:
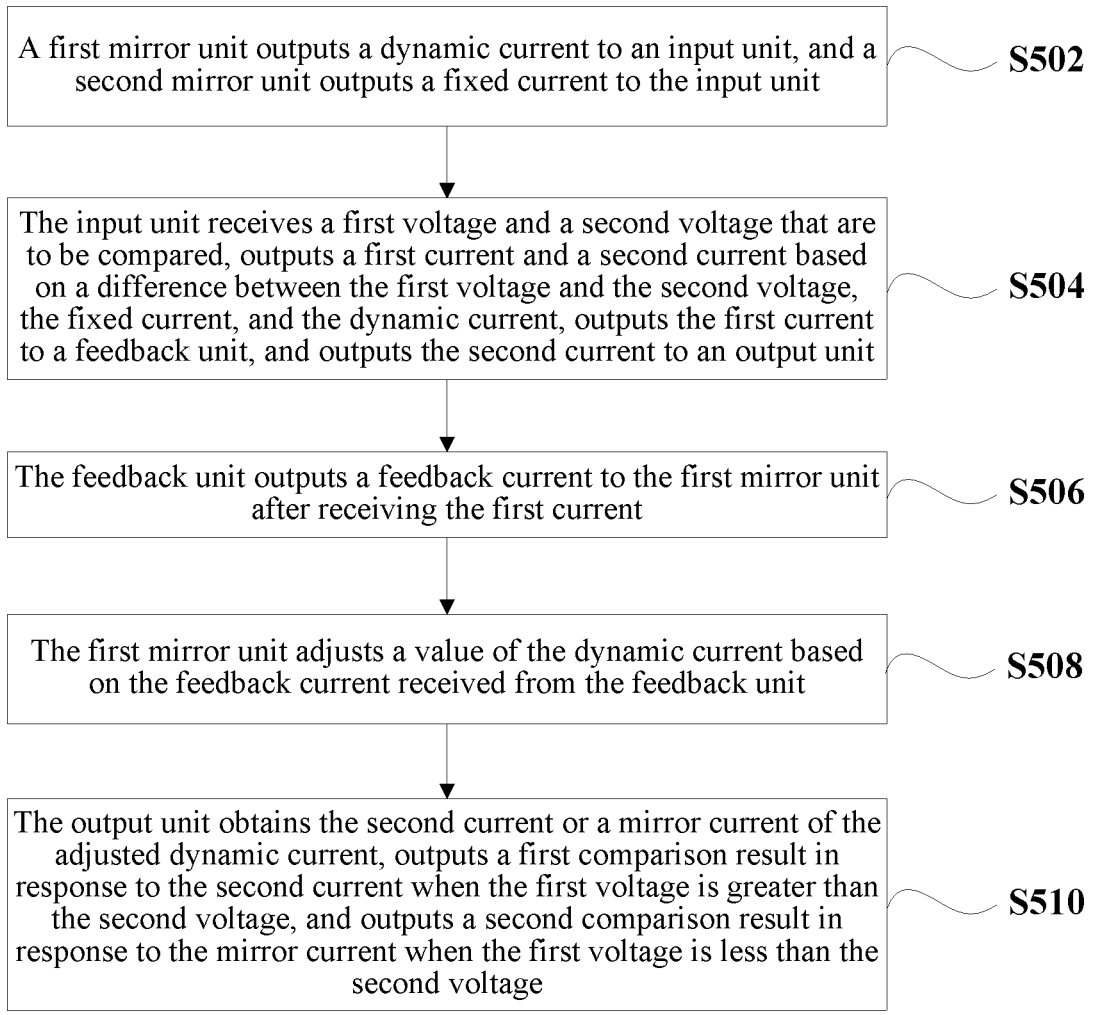
FIG. 5 is a flowchart of a method for comparing voltage values by using a comparator according to some implementations of the present disclosure.

FIG. 5 is a flowchart of a method for comparing voltage values by using a comparator according to some embodiments of the present disclosure.

In step S502, a first mirror unit outputs a dynamic current to an input unit, and a second mirror unit outputs a fixed current to the input unit.

In step S504, the input unit receives a first voltage and a second voltage that are to be compared, outputs a first current and a second current based on a difference between the first voltage and the second voltage, the fixed current, and the dynamic current, outputs the first current to a feedback unit, and outputs the second current to an output unit.

In step S506, the feedback unit outputs a feedback current to the first mirror unit after receiving the first current.

In step S508, the first mirror unit adjusts a value of the dynamic current based on the feedback current received from the feedback unit.

In step S510, the output unit obtains the second current or a mirror current of the adjusted dynamic current, outputs a first comparison result in response to the second current when the first voltage is greater than the second voltage, and outputs a second comparison result in response to the mirror current when the first voltage is less than the second voltage.

In some implementations, a level of the first comparison result is lower than a level of the second comparison result. For example, the first comparison result is a low level (which represents a digital signal "0"), and the second comparison result is a high level (which represents a digital signal "1").

In the foregoing implementations, the input unit outputs the first current to the feedback unit, and the feedback unit outputs the feedback current to the first mirror unit after receiving the first current, thereby implementing dynamic adjustment. The method can improve a comparison speed of the comparator.

Comparing voltage values using the comparator in the embodiments and implementations of the present disclosure can improve a comparison speed, and overcome a mutual restriction relationship between a speed and power consumption in a conventional comparator circuit. In implementations of the disclosed method, a characteristic of the comparator is dynamically adjusted based on an operation status of the comparator without affecting precision of the comparator, thereby implementing low power consumption and a high-speed response.

Herein, the present disclosure has been described in detail. To avoid o the concepts of the present disclosure, some details well-known in the art are not described. A person skilled in the art will understand, based on the descriptions above, how to implement the technical solutions disclosed herein.

Although some specific embodiments and implementations of the present disclosure are described in detail using examples, a person skilled in the art will understand that the examples above are merely for description rather than to limit the scope of the present disclosure. A person skilled in the art will understand that modifications may be made to the embodiments and implementations without departing from the scope and the spirit of the present disclosure. The scope of the present disclosure is defined by the appended claims.

What is claimed is:

1. A comparator, comprising:
   a first mirror unit that is configured to output a dynamic current to an input unit and to adjust a value of the dynamic current based on a feedback current received from a feedback unit;
   a second mirror unit that is configured to output a fixed current to the input unit;
   the input unit, configured to:
   receive a first voltage and a second voltage that are to be compared,
   output a first current and a second current based on a difference between the first voltage and the second voltage, the fixed current, and the dynamic current,
   output the first current to the feedback unit, and
   output the second current to an output unit;

the feedback unit, configured to output a feedback current to the first mirror unit after receiving the first current; and the output unit, configured to:
obtain the second current or a mirror current of the adjusted dynamic current,
output a first comparison result in response to the second current when the first voltage is greater than the second voltage, and
output a second comparison result in response to the mirror current when the first voltage is less than the second voltage.

2. The comparator according to claim 1, wherein:
a feedback current received by the first mirror unit when the first voltage is greater than the second voltage is less than a feedback current received by the first mirror unit when the first voltage is less than the second voltage.

3. The comparator according to claim 1, wherein:
when the first voltage is greater than the second voltage, a smaller difference between the first voltage and the second voltage indicates a larger feedback current.

4. The comparator according to claim 1, wherein:
the first mirror unit comprises a first positive channel metal oxide semiconductor PMOS transistor and a second PMOS transistor, and
a source of the first PMOS transistor and a source of the second PMOS transistor are connected to a supply voltage terminal, a gate of the first PMOS transistor is connected to a gate of the second PMOS transistor, a drain of the first PMOS transistor is connected to the gate of the first PMOS transistor and an output end of the feedback unit, and a drain of the second PMOS transistor is connected to a current input end of the input unit.

5. The comparator according to claim 1, wherein:
the feedback unit comprises a first negative channel metal oxide semiconductor NMOS transistor, and
a source of the first NMOS transistor is connected to a first output end of the input unit, a gate of the first NMOS transistor is connected to a second output end of the input unit, and a drain of the first NMOS transistor serves as the output end of the feedback unit.

6. The comparator according to claim 1, wherein:
the second mirror unit comprises a third PMOS transistor and a fourth PMOS transistor, and
a source of the third PMOS transistor and a source of the fourth PMOS transistor are connected to a supply voltage terminal, a gate of the third PMOS transistor is connected to a gate of the fourth PMOS transistor, a drain of the third PMOS transistor is connected to the gate of the third PMOS transistor and a current source, and a drain of the fourth PMOS transistor is connected to a current input end of the input unit.

7. The comparator according to claim 1, wherein:
the input unit comprises a fifth PMOS transistor, a sixth PMOS transistor, a second NMOS transistor, a third NMOS transistor, a fourth NMOS transistor, and a fifth NMOS transistor,
a source of the fifth PMOS transistor and a source of the sixth PMOS transistor are connected together to serve as a current input end of the input unit,
a gate of the fifth PMOS transistor is configured to receive the first voltage,
a gate of the sixth PMOS transistor is configured to receive the second voltage, a drain of the fifth PMOS transistor is connected to a drain of the second NMOS transistor, a drain of the third NMOS transistor and a gate of the fourth NMOS transistor,
a drain of the sixth PMOS transistor is connected to a drain of the fifth NMOS transistor, a drain of the fourth NMOS transistor and a gate of the third NMOS transistor,
the drain of the second NMOS transistor and a gate of the second NMOS transistor are connected together to serve as a second output end of the input unit,
the drain of the fifth NMOS transistor and a gate of the fifth NMOS transistor are connected together to serve as a third output end of the input unit, and
a source of the second NMOS transistor, a source of the third NMOS transistor, a source of the fourth NMOS transistor and a source of the fifth NMOS transistor are all grounded and together serve as a first output end of the input unit.

8. The comparator according to claim 1, wherein:
the output unit comprises a seventh PMOS transistor and a sixth NMOS transistor,
a source of the seventh PMOS transistor is connected to a supply voltage terminal,
a gate of the seventh PMOS transistor is connected to a gate of a second PMOS transistor,
a drain of the seventh PMOS transistor is connected to a drain of the sixth NMOS transistor,
a gate of the sixth NMOS transistor is connected to a third output end of the input unit, and
a source of the sixth NMOS transistor is grounded.

9. The comparator according to claim 8, wherein:
the output unit further comprises a shaping filter; and
an input end of the shaping filter is connected to the drain of the seventh PMOS transistor, and an output end of the shaping filter is configured to output the first comparison result or the second comparison result.

10. The comparator according to claim 9, wherein:
the shaping filter comprises a first phase inverter and a second phase inverter that are cascaded; and
an input end of the first phase inverter is connected to the drain of the seventh PMOS transistor, an output end of the first phase inverter is connected to an input end of the second phase inverter, and an output end of the second phase inverter serves as the output end of the shaping filter.

11. The comparator according to claim 9, wherein:
the output unit further comprises a seventh NMOS transistor, connected to the shaping filter, and configured to control the shaping filter to output the first comparison result or the second comparison result after receiving an enabling signal.

12. The comparator according to claim 1, wherein:
a level of the first comparison result is lower than a level of the second comparison result.

13. An integrated circuit, comprising the comparator according to claim 1.

14. A method for comparing voltage values using the comparator according to claim 1, comprising:
outputting, by the first mirror unit, the dynamic current to the input unit, and outputting, by the second mirror unit, the fixed current to the input unit;
receiving, by the input unit, the first voltage and the second voltage that are to be compared, outputting first current and the second current based on a difference between the first voltage and the second voltage, the fixed current, and the dynamic current, outputting the first current to the feedback unit, and outputting the second current to the output unit;

outputting, by the feedback unit, the feedback current to the first mirror unit after receiving the first current;

adjusting, by the first mirror unit, the value of the dynamic current based on the feedback current received from the feedback unit; and obtaining, by the output unit, the second current or the mirror current of the adjusted dynamic current, outputting the first comparison result in response to the second current when the first voltage is greater than the second voltage, and outputting the second comparison result in response to the mirror current when the first voltage is less than the second voltage.

* * * * *